United States Patent
Matsubara et al.

(10) Patent No.: US 9,553,052 B2
(45) Date of Patent: Jan. 24, 2017

(54) MAGNETIC SHIELDING PACKAGE OF NON-VOLATILE MAGNETIC MEMORY ELEMENT

(71) Applicant: J-DEVICES CORPORATION, Usuki-shi, Oita (JP)

(72) Inventors: Hiroaki Matsubara, Yokohama (JP); Toshihiro Iwasaki, Yokohama (JP); Tomoshige Chikai, Yokohama (JP); Kiminori Ishido, Yokohama (JP); Shinji Watanabe, Yokohama (JP); Michiaki Tamakawa, Yokohama (JP)

(73) Assignee: J-DEVICES CORPORATION, Usuki-shi, Oita (JP)

( * ) Notice: Subject to any disclaimer, the term of this patent is extended or adjusted under 35 U.S.C. 154(b) by 0 days.

(21) Appl. No.: 14/963,970

(22) Filed: Dec. 9, 2015

(65) Prior Publication Data

US 2016/0172580 A1     Jun. 16, 2016

(30) Foreign Application Priority Data

Dec. 10, 2014   (JP) ................. 2014-249717

(51) Int. Cl.
  *H01L 29/82*    (2006.01)
  *H01L 23/552*   (2006.01)

(52) U.S. Cl.
  CPC ................... *H01L 23/552* (2013.01)

(58) Field of Classification Search
  USPC .............. 257/295, E43.001–E43.007, 257/E27.005–E27.006, E27.008, E29.164, 257/E29.167, E29.272, E29.323, E21.436, 257/E21.633–E21.665, 751, 774, 762, 257/200, 758, 288, 298, E21.579, 776, 257/E21.586, E21.257, 773, 374, 257/499–564, 763, 757, 100, 433, 257/787–796, E31.117–E31.118, E51.02, 257/E23.116–E23.14, 678–733, 257/E23.001–E23.1; 438/3, 785, E21.208, 438/762, 639, 643, 687, 637, 485, 582, 438/19, 15, 669, 709, 730, 597, 299, 448, 438/396, 253, 200, 656, 642, 640, 627, 438/648, 622; 365/148, 158, 163, 171, 365/185.18, 145, 189.16, 185.24, 365/185.29, 189.12, 200, 230.05, 72, 78, 365/87, 96
  See application file for complete search history.

(56) References Cited

U.S. PATENT DOCUMENTS

2010/0164077 A1 * 7/2010 Bando ............... H01L 23/49503
                                                  257/659
2011/0304015 A1 * 12/2011 Kim ..................... H01L 23/552
                                                  257/532

FOREIGN PATENT DOCUMENTS

| JP | 2004-047656 A | 2/2004 |
| JP | 3879566 B2 | 11/2006 |
| JP | 3879576 B2 | 11/2006 |
| WO | WO 2011/111789 A1 | 9/2011 |

\* cited by examiner

*Primary Examiner* — Tram H Nguyen
(74) *Attorney, Agent, or Firm* — Flynn, Thiel, Boutell & Tanis, P.C.

(57) ABSTRACT

A magnetic shielding package of a non-volatile magnetic memory element, including: a soft magnetic material support plate 12; a first insulating material layer 13 formed on the support plate; a non-volatile magnetic memory element 11 fixed on the first insulating material layer; a second insulating material layer 14 that encapsulates the memory element and the periphery thereof; in the second insulating material layer, a wiring layer 15, a soft magnetic layer 15*b* or 25 and a conductive portion 16 connecting an electrode of the circuit surface of the memory element and the wiring layer; and a magnetic shield part 17 containing a soft magnetic material arranged like a wall at a distance from a side surface of the memory element so as to surround the memory element side surface partially or entirely, the magnetic shield part being magnetically connected to the soft magnetic layer.

4 Claims, 12 Drawing Sheets

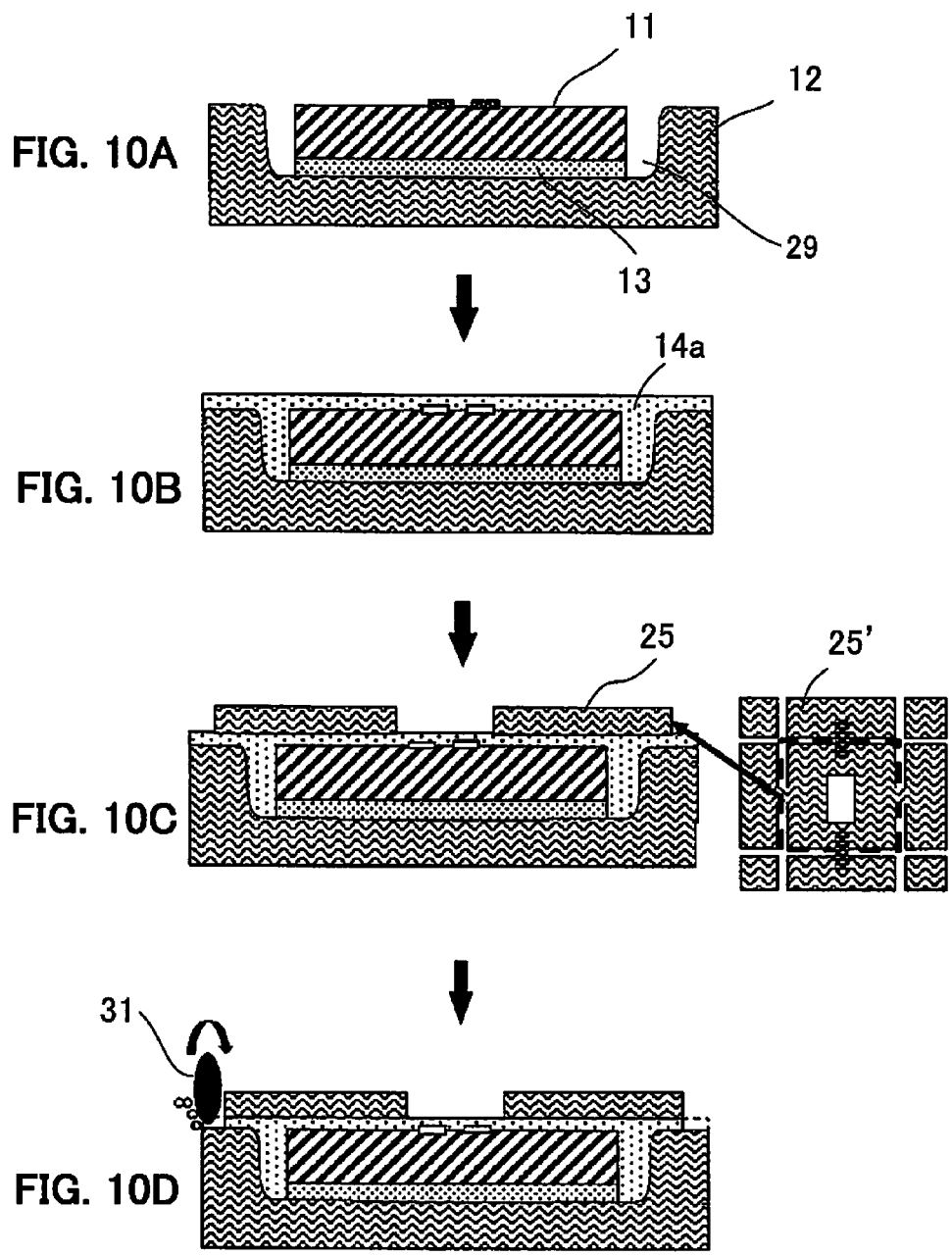

MAGNETIC SHIELDING PACKAGE OF NON-VOLATILE MAGNETIC MEMORY ELEMENT

BACKGROUND OF THE INVENTION

1. Field of the Invention

The present invention relates to a magnetic shielding package of a non-volatile magnetic memory element. In particular, the present invention relates to a magnetic shielding package of a non-volatile magnetic memory element for suppressing the influence of an external magnetic field on the non-volatile magnetic memory element.

2. Description of the Related Art

A MRAM (Magnetoresistive Random Access Memory) that is a memory utilizing a magnetic substance is a non-volatile memory that can store a memory without any power supply from outside. Thus, it is a memory that does not require standby power, has unlimited rewriting endurance and high-speed performance, and is expected to consume a low power and increase its capacity.

However, the basic element of the MRAM stores information in the direction of spontaneous magnetization of the magnetic substance, and thus, by an irradiation with external magnetic field of about 10 to 50 [Oe] that is a reverse magnetic field intensity of the MRAM element, there is a possibility that the stored information is deleted or rewritten.

The MRAM element is generally mounted on a substrate in an electronic device. A semiconductor element, an element for communication, an ultrasmall motor, and the like are densely mounted on a substrate in addition to the MRAM element. Moreover, in the electronic device, a power supply unit, an antenna element, and the like are mounted. Therefore, a magnetic field at a relatively low frequency of about 100 to 300 [Oe] is present around the MRAM element. Thus, a magnetic field blocking shield is required to mount the MRAM.

A magnetic non-volatile memory element (or non-volatile magnetic memory element) including a magnetic field blocking shield has been proposed conventionally (Japanese Patent No. 3879566, Japanese Patent No. 3879576, WO 2011/111789, Japanese Patent Application Publication No. 2004-047656).

FIG. 13 shows a structure of the non-volatile magnetic memory element described in Japanese Patent No. 3879566. In FIG. 13, a MRAM element 11 is connected to a lead frame 13 with a wire 12 in a magnetic shielding package 10, and an encapsulation resin 14 containing a soft magnetic material encapsulates around the MRAM element 11. This magnetic shielding package 10a is connected to the substrate 20 with a lead extended from the lead frame 13.

FIG. 14 shows a structure of the magnetic non-volatile memory element described in Japanese Patent No. 3879576.

The magnetic non-volatile memory element 11 is connected to a lead frame 13 with a wire 12. The entire periphery of the MRAM element 11 is surrounded by a magnetic shield member 14 obtained by adhering the moldings that are formed using a soft magnetic material made of a soft magnetic metal or a soft magnetic alloy and magnetically continue, and thus, the MRAM element 11 is arranged in the state of being shielded magnetically. This magnetic shielding structure is a structure in which a MRAM chip is covered with a material (air) with a low magnetic permeability, and the outer periphery thereof is covered with a soft magnetic material having a high magnetic permeability. In this case, the static magnetic field/low frequency magnetic field pass through a soft magnetic material having a high magnetic permeability, and a material having a low magnetic permeability between the MRAM chip and the soft magnetic material prevent the entering of a magnetic flux to the MRAM side. Thus, a higher shielding effect on the MRAM chip can be obtained.

The magnetic device disclosed in WO 2011/111789 is provided from the viewpoint of facilitating the production process thereof and improving the magnetic-shielding performance and the magnetic device comprises a magnetic element and a magnetic shield having an opening wherein the magnetic shield comprises an upper part and a lower part which overlap each other in a shield region, and also comprises a side part which physically connects the upper part to the lower part. The magnetic element is arranged between the upper part and the lower part without getting out of the shield region.

Japanese Patent Application Publication No. 2004-047656 discloses a magnetic non-volatile memory device (MRAM device) with a magnetic shielding structure for suppressing the influence of external magnetic fields. The MRAM device has a magnetic shielding layer formed using a soft magnetic metal on the surface thereof for suppressing the penetration of magnetic flux into the device and penetration of magnetic flux into the MRAM device is suppressed. Furthermore, Japanese Patent Application Publication No. 2004-047656 describes that since a soft magnetic metal is used for forming the magnetic shielding layer, the magnetic shielding layer can be obtained with a higher permeability as compared to one made from a soft magnetic metal oxide such as a ferrite.

Note that in FIGS. 13 and 14, reference numerals are shown as in Japanese Patent No. 3879566 and Japanese Patent No. 3879576.

In the magnetic shielding structure described in Japanese Patent No. 3879566, the magnetic substance and the MRAM chip are in contact with each other. Thus, it is considered that there is an effect on the high frequency magnetic field. However, as to the static magnetic field/low frequency magnetic field, a magnetic flux is concentrated in a region of the magnetic substance, and thus, there is a possibility that the magnetic field reaching the MRAM increases.

In the magnetic shielding structure described in Japanese Patent No. 3879576, a soft magnetic material made of a metal/alloy having a high magnetic permeability, such as permalloy, is used as a shielding material, and thus, a large magnetic shielding effect can be expected, compared with the case of using an insulating soft magnetic material such as a magnetic-filler containing a resin, ferrite or the like. In this structure, it is desired that the all directions of the MRAM chip are shielded with a soft magnetic metal material. However, since the covering is performed by a metal, it is required to pay careful attention to the way of leading a wire out.

SUMMARY OF THE INVENTION

An object of the present invention is to provide a magnetic shielding package of a non-volatile magnetic memory element, being capable of being produced easily and having a highly magnetic shielding effect and a method for producing the same.

The inventors of the present invention conducted earnest studies and found that the above-described problem can be solved by causing the magnetic shielding package of the non-volatile magnetic memory element to have a structure in which a non-volatile magnetic memory element is arranged on a support plate made of a soft magnetic material via a first insulating material layer, this non-volatile magnetic memory element and the periphery thereof are encapsulated with a second insulating material layer, an opening having a channel shape that surrounds the side surface of the non-volatile magnetic memory partially or entirely is formed in the second insulating material layer on the side surface side of the non-volatile magnetic memory element, a conductive portion containing a soft magnetic material is formed in the opening, and a wiring layer is formed on the second insulating material layer. The inventors have thus completed the present invention.

That is, the present invention relates to a magnetic shielding package of a non-volatile magnetic memory element described below.

(1) A magnetic shielding package of a non-volatile magnetic memory element that suppresses an influence of an external magnetic field on the non-volatile magnetic memory element, comprising:
 a support plate comprising a soft magnetic material;
 a first insulating material layer formed on the support plate;
 a non-volatile magnetic memory element, the face of which opposite to a circuit face of the element is fixed on the first insulating material layer;
 a second insulating material layer that encapsulates the non-volatile magnetic memory element and the periphery thereof;
 a wiring layer provided in the second insulating material layer;
 a soft magnetic layer that is provided in the second insulating material layer and comprises a soft magnetic material;
 a conductive portion that is provided in the second insulating material layer and connects an electrode in the circuit face of the non-volatile magnetic memory element and the wiring layer; and
 a magnetic shield part containing a soft magnetic material that is arranged like a wall with a distance from a side surface of the non-volatile magnetic memory element so as to surround the side surface of the non-volatile magnetic memory element partially or entirely, wherein
 the soft magnetic layer and the magnetic shield part are magnetically connected to each other.

In the present specification, the term "circuit face" is used to mean the face of a non-volatile magnetic memory element or MRAM having a circuit, unless otherwise specified.

(2) The magnetic shielding package of a non-volatile magnetic memory element according to item (1) above, wherein the wiring layer has a two-layer laminate structure formed of a conductor layer comprising a conductive material and the soft magnetic layer comprising a soft magnetic material.

(3) The magnetic shielding package of a non-volatile magnetic memory element according to item (1) or (2) above, wherein the magnetic shield part forms a two-layer structure formed of a conductor layer comprising a conductive material and a soft magnetic layer comprising a soft magnetic material.

(4) The magnetic shielding package of a non-volatile magnetic memory element according to item (1) above, wherein the soft magnetic layer is formed in the second insulating material layer that is between the non-volatile magnetic memory element and the wiring layer, and has an opening in a portion thereof corresponding to an electrode in the circuit face of the non-volatile magnetic memory element, the conductive portion being arranged in the opening.

(5) The magnetic shielding package of the non-volatile magnetic memory element according to any one of the items (1) to (4) above, wherein the soft magnetic material arranged like a wall is integrally provided with the support plate.

(6) The magnetic shielding package of a non-volatile magnetic memory element according to item (5) above, wherein the support plate is obtained by providing a cavity in a flat plate, and a surrounding portion that forms the cavity forms the soft magnetic material arranged like a wall.

(7) The magnetic shielding package of a non-volatile magnetic memory element according to item (1) above, wherein the material of the wiring layer provided in the second insulating material layer is a conductive soft magnetic material, and the wiring layer also serves as the soft magnetic layer.

ADVANTAGEOUS EFFECTS OF INVENTION

The magnetic shielding package of the present invention can exert the following effects.
 The non-volatile magnetic memory element is covered with an insulating resin material with a relatively low magnetic permeability that also insulates a wiring, and the outer periphery of the non-volatile magnetic memory element is covered with a high magnetic permeability material. In such an arrangement, the relatively low magnetic permeability material is present between the non-volatile magnetic memory element and the high magnetic permeability material and the magnetic flux concentrated in the high magnetic permeability material is significantly prevented from reaching the non-volatile magnetic memory element. Thus, a shielding effect of suppressing the entering of a static magnetic field/low frequency magnetic field into a memory element is obtained.
 Each soft magnetic material that surrounds the non-volatile magnetic memory element has an appropriate insulation structure by an insulating material, and as the soft magnetic material, a soft magnetic metal material that can have a magnetic permeability higher than that of the soft magnetic material having insulation properties can be used. Thus, the improvement in shielding effect can be achieved.
 A soft magnetic material is used in a support plate that is required to maintain the rigidity of the semiconductor device, and the support plate is also used as a lower shield, and the upper shield is formed at the same time as forming a wiring layer or is formed in the wiring layer. Thus, the number of extra steps is not increased, and a low cost can be achieved.

BRIEF DESCRIPTION OF DRAWINGS

FIGS. 10A to 10D are drawings showing a part of the production process of the magnetic shielding package of the third embodiment.

DETAILED DESCRIPTION OF THE PREFERRED EMBODIMENTS

The embodiments of the present invention are described below. Although the embodiments are described below with reference to the drawings, the drawings are merely provided in order to illustrate the embodiments, and the present invention is not limited by the drawings.

First Embodiment

Figure 1:
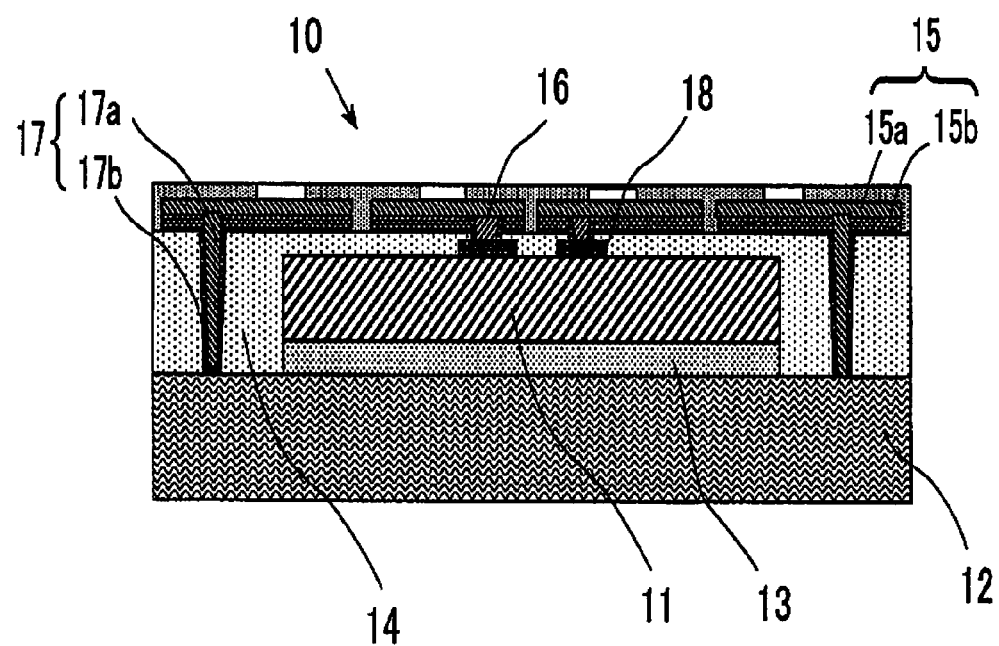
FIG. 1 is a drawing showing an example of the structure of a magnetic shielding package of a first embodiment.

FIG. 1 shows the structure of a magnetic shielding package of a first embodiment.

FIG. 1 is a longitudinal cross-sectional view of the magnetic shielding package of the non-volatile magnetic memory element (hereinafter also referred to as the "magnetic shielding package") according to the present invention.

A magnetic shielding package 10 shown in FIG. 1 includes a non-volatile magnetic memory element 11 that has an electrode 18, a support plate 12 made of a soft magnetic material, a first insulating material layer 13, a second insulating material layer 14, a wiring layer 15, a conductive portion 16, and a magnetic shield part 17.

The non-volatile magnetic memory element 11 is fixed on the first insulating material layer 13 formed on the support plate 12. The non-volatile magnetic memory element 11 and the periphery thereof are encapsulated with the second insulating material layer 14. The wiring layer 15 has a laminate structure formed of a conductor layer 15a made of a high-conductive material such as Cu and a soft magnetic layer 15b made of a soft magnetic material.

The magnetic shield part 17 has a laminate structure of a conductor layer 17a made of a high-conductive material and a soft magnetic layer 17b.

The soft magnetic material is a material characterized in small coercivity and large magnetic permeability. Examples of a soft magnetic material having a conductivity include soft magnetic metals such as Fe, Co, Ni, etc., and soft magnetic alloys such as FeNi, FeCo, FeAl, FeSi, FeSiAl, FeSiB, CoSiB, etc. Moreover, examples of a soft magnetic material having insulation properties include NiZn ferrite, MnZn ferrite, MgMn ferrite, NiZnCu ferrite, NiZnCo ferrite, etc.

As a soft magnetic material used for the support plate 12, commercially available permalloy plate or the like can be used. The thickness of the support plate 12 is desirably about 200 μm or more because of the requirement of rigidity for preventing warping and the like in the production process of the magnetic shielding package 10.

As the first insulating material layer 13, a die attach film (DAF) can be used.

The non-volatile magnetic memory element (hereinafter also referred to as MRAM) can be mounted on the support plate 12 by using this die attach film.

The material for forming the second insulating material layer 14 that covers the side surface and the upper surface of the MRAM 11 is required to have a low expansion coefficient, a chemical resistance to a plating solution, a heat resistance to solder reflow during packaging and the like for preventing warping.

Such a material is a film molding material made of an epoxy hybrid material for burying a Fan-Out package chip or a silicon hybrid material for vacuum lamination.

The reason why the wiring layer 15 is configured to have a two-layer structure of the conductor layer 15a and the soft magnetic layer 15b is as follows.

From the viewpoint of enhancing the magnetic shielding performance, the wiring layer 15 is preferably made of a soft magnetic material. However, a soft magnetic material such as permalloy has a high resistance, and thus, in order to reduce the resistance of the wiring layer 15, the wiring layer 15 is configured to have a two-layer structure of the conductor layer 15a and the soft magnetic layer 15b.

In the magnetic shielding package shown in FIG. 1, a plating method is specifically employed in order to cause the wiring layer 15 to have a two-layer structure. Thus, as mentioned below, in the production process, the magnetic shield part 17 also has a laminate structure of a conductor layer 17a made of a material having a high conductivity and a soft magnetic layer 17b on the outside thereof.

If there is no problem with the products, even if the wiring layer 15 has a high resistance, the wiring layer 15 can be formed only of a soft magnetic material. An embodiment in which the wiring layer 15 is formed only of a soft magnetic material is described below as a fourth embodiment.

<Production Process>

A process for producing a magnetic shielding package shown in FIG. 1 is described below in the order of steps based on FIGS. 2 and 3.

Figure 2A:
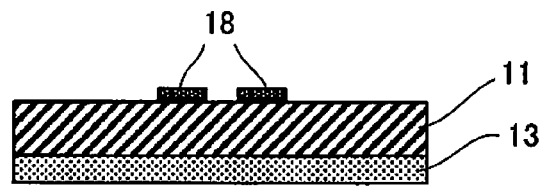
FIGS. 2A to 2C are drawings showing a part of the production process of the magnetic shielding package of the first embodiment.

A MRAM 11 having an electrode 18 at a circuit face thereof and a support plate 12 made of a soft magnetic material are provided. A first insulating material layer 13 is formed on the face of the MRAM 11, opposite to the circuit face of the MRAM 11. As the first insulating material layer, a die attach film is used (FIG. 2A).

Figure 2B:
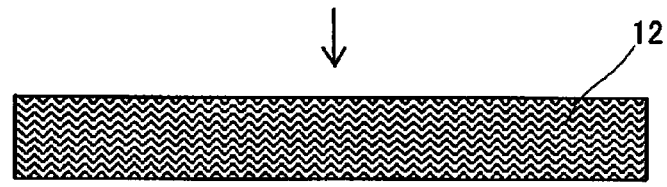

The MRAM 11 is fixed on the surface of the support 12 (FIG. 2B).

Figure 2C:
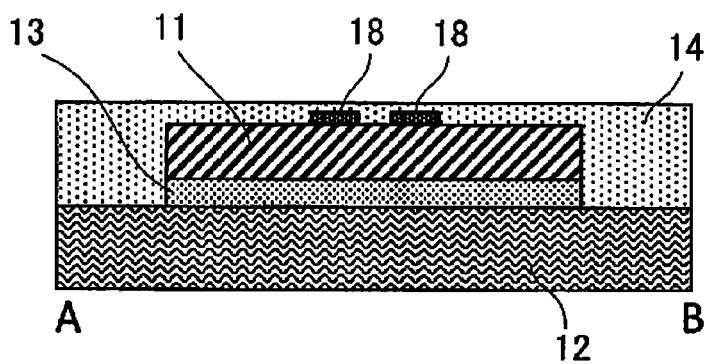

The MRAM 11 and the periphery thereof (the surface thereof and the surface of the support plate) are encapsulated with the second insulating material layer 14 (FIG. 2C).

Figure 3A:
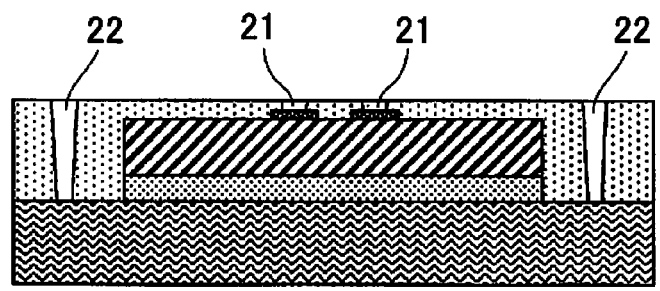
FIGS. 3A to 3C are drawings showing a part of the production process of the magnetic shielding package of the first embodiment.
Figure 3B:
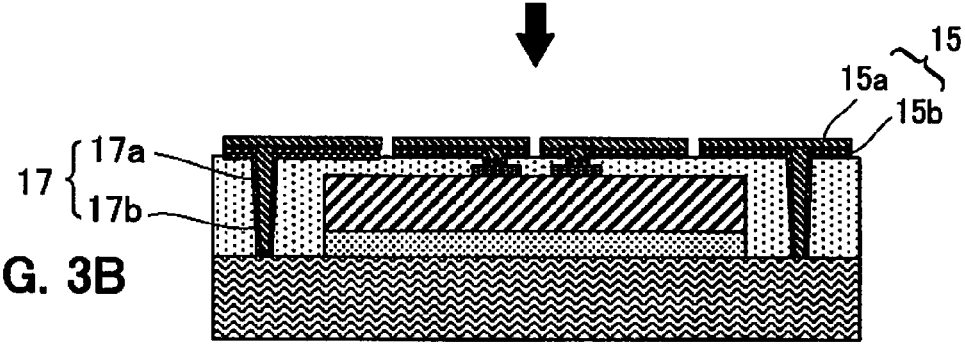

An opening 21 for forming a conductive portion (via portion) so as to correspond to the position of the electrode 18 of the MRAM 11 is formed in the encapsulation resin 14 (FIG. 3A).

A groove 22 is formed with a distance from the side surface of the MRAM 11 so as to surround the side surface of the MRAM partially or entirely.

The opening 21 and the groove 22 may be formed by laser processing. In this case, the area of the groove 22 is large and pinpoint processing results in a poor productivity. Therefore, pattern transfer, such as a mask imaging method or the like, may be used. The mask imaging method is a method in which a mask pattern is transferred in a reduced size to a subject to be processed by irradiation of a laser beam which converges after being passed through the pattern mask. It is preferred that the kind of laser beam is a laser beam with a short wavelength, and an ablation processing is used with this laser beam, from the viewpoint of the reduction in the influence of heat. Alternatively, the groove 22 may be formed mechanically by dicing blades, a milling machine to which an end mill is attached, or the like.

The via bottom is subjected to desmear, if necessary, a seed layer of Cu or the like is thereafter formed by non-electrolytic plating, sputtering, or the like, the resist patterning is performed, a double layer plating of permalloy and Cu is performed to embed the magnetic substance and the conductor. Wiring layers 15 (15*a*, 15*b*) are formed, and a conductive portion 16 is formed in the opening 21 (via). The magnetic shield parts 17 (17*a*, 17*b*) are formed in the groove 22 (in FIG. 3B).

The seed layer is removed by etching after removing the resist.

Figure 3C:
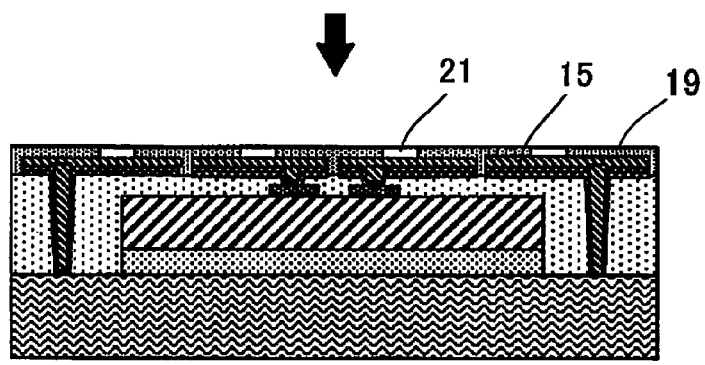

A solder resist or the like is applied to the wiring layers 15 to forma wiring protection layer 19, openings are thereafter provided in the wiring protection layer 19, the surface of the Cu layer is subjected to an oxidation preventive process such as OSP (Organic Solderability Preservative) or the like in order to obtain favorable solder wettability as needed, and thus, an external electrode is obtained (FIG. 3C).

The magnetic substance is embedded in the groove 22 by plating in the above-described method. However, when the soft magnetic layer 17*b* is thin, and a magnetic shielding effect is not sufficient, a soft magnetic paste containing soft magnetic particles and a thermosetting resin may be embedded in the groove 22 before plating.

In the actual production process, multiple shielding packages are produced using a large-area support plate.

Figure 4:
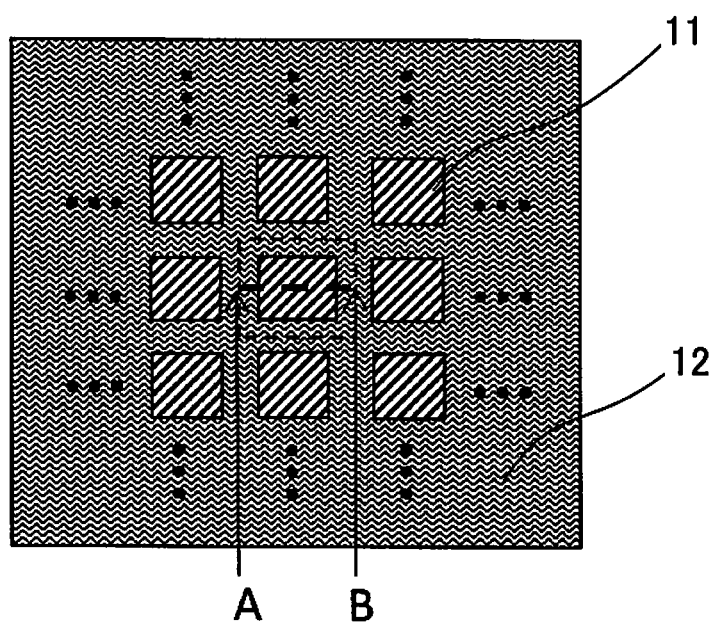
FIG. 4 is a drawing showing the state where multiple MRAMs 11 are arranged and fixed on a large-area support plate 12.

FIG. 4 is a drawing showing the state where multiple MRAMs 11 are arranged and fixed on a large-area support plate 12. FIG. 2C shows a cross section obtained by cutting a portion indicated by a square broken line in the middle part of FIG. 4 by a cutting line indicated by A-B.

Figure 5:
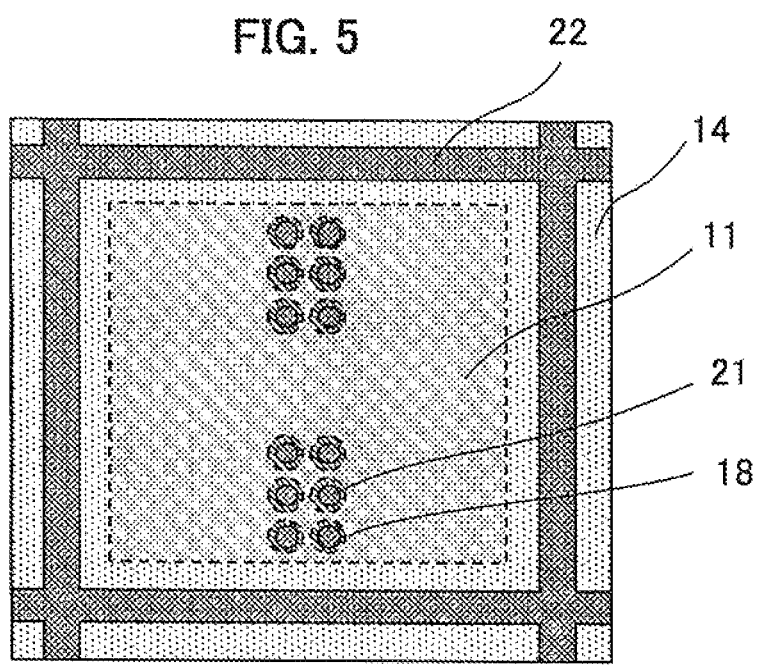
FIG. 5 is a top view of the magnetic shielding package in the state of FIG. 3B and shows an example of the position of openings in an insulating material layer before wiring plating.
Figure 6:
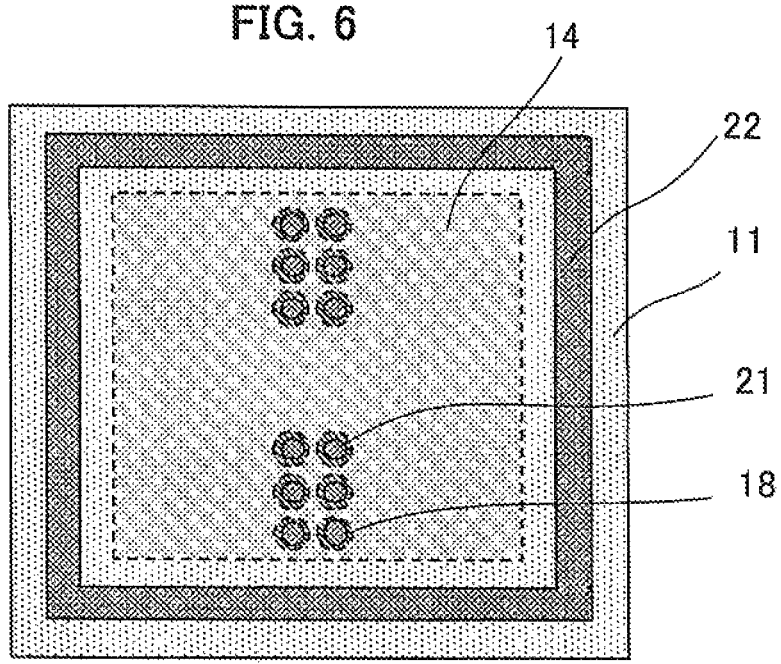
FIG. 6 is a top view of the magnetic shielding package in the state of FIG. 3B and shows another example of the position of openings in an insulating material layer before wiring plating.

FIGS. 5 and 6 are top views of FIG. 3A and each shows the shape of the groove 22 and the positions of the electrodes 18 and the openings 21.

In FIGS. 5 and 6, the MRAM 11 and the electrodes 18 are shown in the perspective state.

FIG. 5 shows an example of forming a groove 22 using a dicing blade, and the groove 22 protrudes from the package.

FIG. 6 shows an example of forming a groove 22 by laser processing. In the case of laser processing, as shown in FIG. 6, the groove 22 can be formed so as not to protrude from the package.

Second Embodiment

Figure 7:
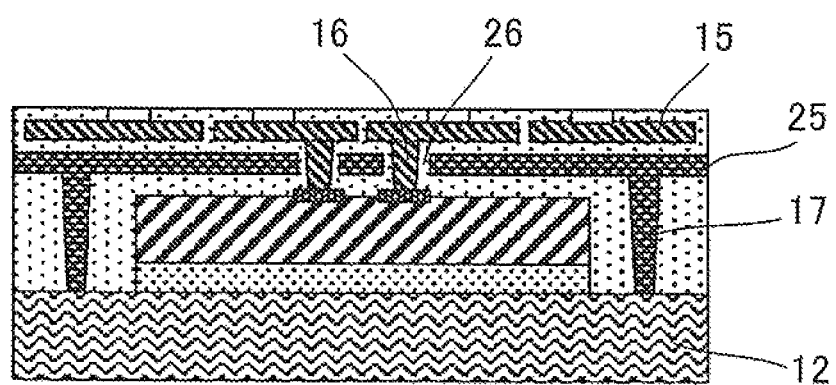
FIG. 7 is a drawing showing an example of the structure of a magnetic shielding package of a second embodiment.

FIG. 7 shows the structure of a magnetic shielding package of a second embodiment.

In the first embodiment, the wiring layer is configured to have a laminate structure formed of a conductor layer 15*a* and a soft magnetic layer 15*b*. In the present embodiment, as shown in FIG. 7, a conductor layer and a soft magnetic layer are separated, and the conductor layer and the soft magnetic layer are individually provided as a wiring layer 15 and a soft magnetic layer 25 in a second insulating material layer 14. This soft magnetic layer 25 is provided with openings 26 in a portion in which conductive portions 16 are arranged.

With such a structure, the upper surface of the MRAM except for the openings 26 in which the conductive portions 16 are arranged can be completely covered with the soft magnetic layer, and thus, the static magnetic field/low frequency magnetic field shielding effect is improved.

The conductor layer as the wiring layer 15 and the soft magnetic layer 25 can be produced by the same plating method as in the first embodiment.

The wiring layer 15 may be configured to have a two-layer structure of a conductor layer and a soft magnetic layer as in the first embodiment.

The soft magnetic layer 25 in the present embodiment is not required to be subjected to patterning except for the portions of the openings 26 and thus can be formed by a method other than the plating method, and the thickness of the soft magnetic layer can be easily increased, compared with the first embodiment.

For example, the soft magnetic layer of the magnetic shield part 17 and the soft magnetic layer 25 are formed by injecting a soft magnetic paste by printing or the like.

The soft magnetic layer 25 can be formed by a foil of permalloy or the like.

FIG. 8A to 8D show a magnetic shielding package in which a soft magnetic layer 25 is formed by a foil 25' of permalloy or the like.

FIGS. 8A to 8D show the production process of a magnetic shielding package using a foil 25'.

The cross-sectional views of FIGS. 8A to 8D shows cross sections obtained by cutting along a broken line shown in the right view of FIG. 8B.

A foil 25' in which a pattern is formed in advance is provided (see FIG. 8A).

As shown in FIG. 8A, in the foil 25', an opening 26 is formed by removing a region corresponding to the conductive portion by etching, and a notch 28 is provided by etching in such a manner that a linkage portion 27 is left without being etched, in order to cause the dicing blade to be easily passed through the outside of the region.

The foil 25' is laminated on the upper surface of the insulating material layer 14 by a high precision attaching device to form a soft magnetic layer 25 (see FIG. 8B).

A groove for a magnetic shield part 17 is formed in the insulating material layer 14 on the outer periphery of the non-volatile magnetic memory element (see FIG. 8C).

A milling machine to which an end mill is attached can be used for forming the groove.

A soft magnetic paste 32 is injected into the groove using a dispenser 31.

The wiring layer 15 and the wiring protection layer 19 are formed, and dicing is thereafter carried out along a dicing line 33 to achieve singulation (see FIG. 8D).

Third Embodiment

Figure 9:
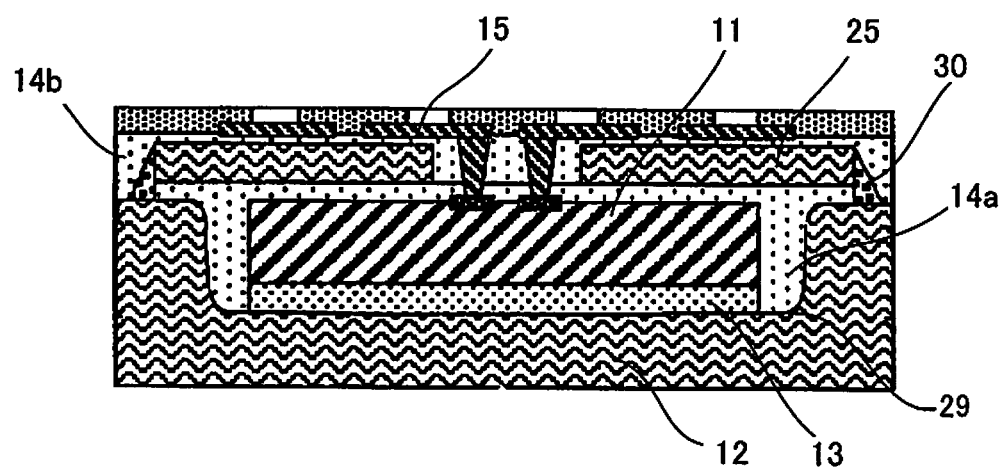
FIG. 9 is a drawing showing an example of the structure of a magnetic shielding package of a third embodiment.

FIG. 9 shows the structure of a magnetic shielding package of a third embodiment.

In the present embodiment, a magnetic shielding package is configured using a support plate 12 having a cavity 29.

In the cavity 29, the MRAM 11 is encapsulated with a second insulating material layer 14*a*.

Figure 8:
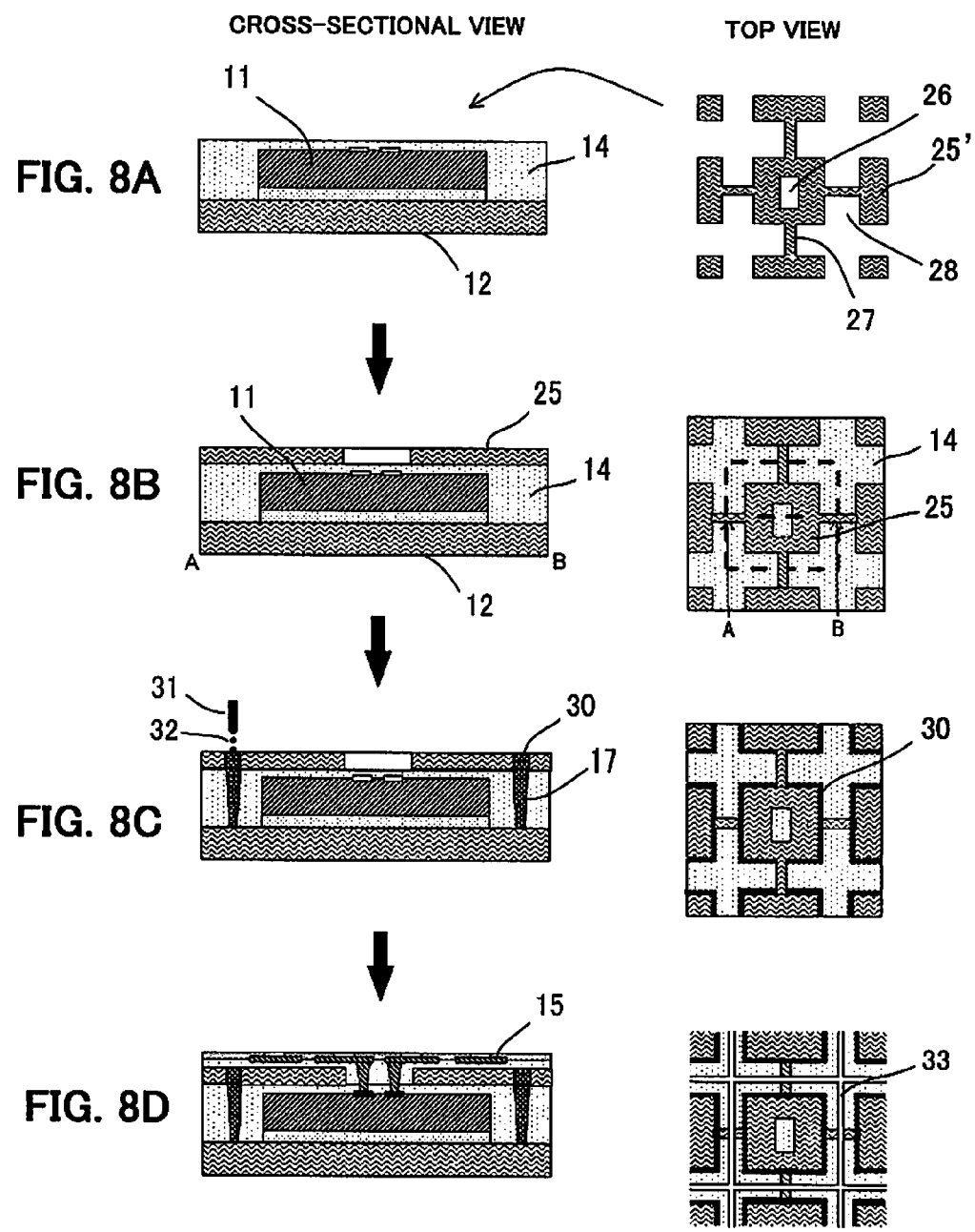
FIGS. 8A to 8D are drawings showing the production process of the magnetic shielding package of the second embodiment.

A soft magnetic layer 25 formed of a foil 25' is laminated on the upper surface of the second insulating material layer 14a as in the magnetic shielding package shown in FIG. 8 and is encapsulated with a second insulating material layer 14b.

The soft magnetic layer 25 and the support plate 12 are magnetically connected to each other by a connection portion 30.

A side wall portion of the support 12 having the cavity 29 is used as a magnetic shielding layer in the present embodiment. Thus, a higher static magnetic field/low frequency magnetic field shielding effect can be obtained by increasing the thickness of the side wall of the support plate 12.

<Production Process>

A process for producing a magnetic shielding package of the third embodiment is described below in the order of steps based on FIGS. 10 and 11.

A MARM 11 is fixed on the bottom surface of the cavity 29 of the support plate 12 made of a soft magnetic material having a cavity via a first insulating material layer 13 (FIG. 10A).

The MRAM 11 and the periphery thereof are encapsulated with a second insulating material layer 14a (FIG. 10B).

The foil 25' in which a pattern is formed is laminated on the upper surface of the second insulating material layer 14a (see FIG. 10C).

An insulating material on the upper end outer periphery of the support plate 12 is removed by a blade 31 (FIG. 10D).

Figure 11A:
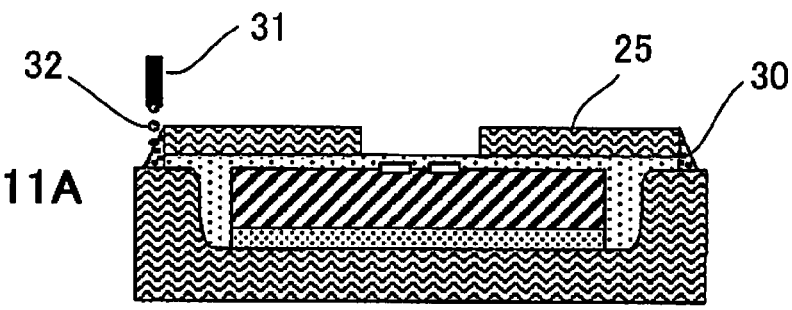
FIGS. 11A to 11D are drawings showing a part of the production process of the magnetic shielding package of the third embodiment.

A soft magnetic paste 32 containing soft magnetic particles and a thermosetting resin is applied to a portion in which the insulating material is removed by the blade 31, using a dispenser 31 to form a connection portion 30 (FIG. 11A).

Figure 11B:
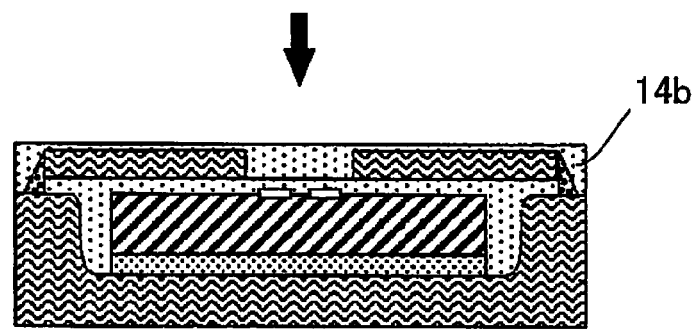

The soft magnetic layer and the connection portion 30 are encapsulated with an insulating material layer 14b (FIG. 11B).

Figure 11C:
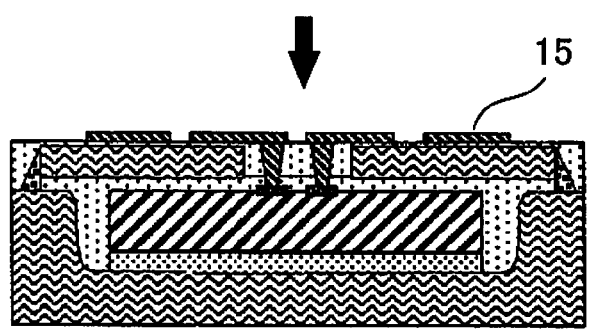

A wiring layer 15 is formed on the upper surface of the insulating material layer 14b (FIG. 11C).

Figure 11D:
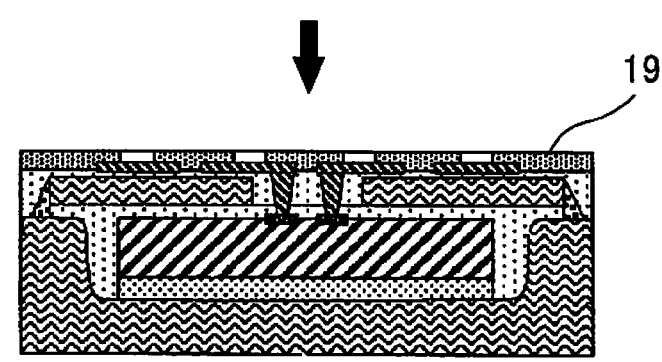

A wiring protection layer 19 is formed on the upper surface of the wiring layer 15 (FIG. 11D).

The soft magnetic layer 25 is formed on the upper surface of the second insulating material layer 14a by the foil 25' in the above-described method. However, the soft magnetic layer 25 may be formed by a plating method.

In the case of using the plating method, the wiring layer 15 and the soft magnetic layer 25 are integrated to form a laminate structure as in the first embodiment.

The connection portion 30 may be exposed to the outside of the package.

Fourth Embodiment

Figure 12:
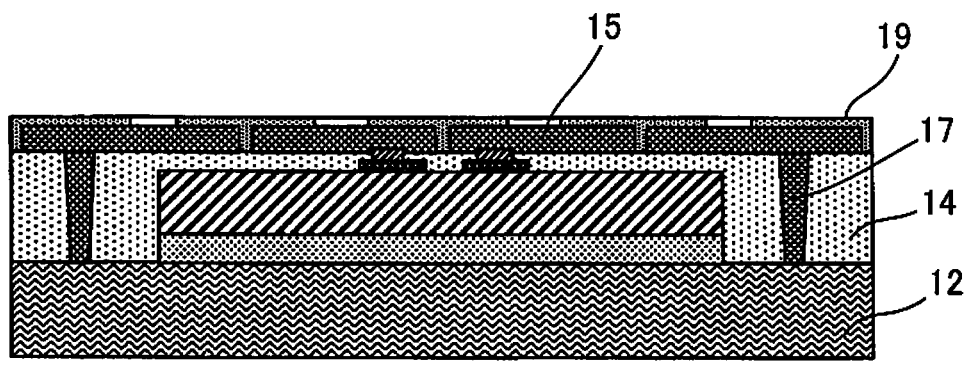
FIG. 12 is a drawing showing an example of the structure of a magnetic shielding package of a fourth embodiment.
Figure 13:
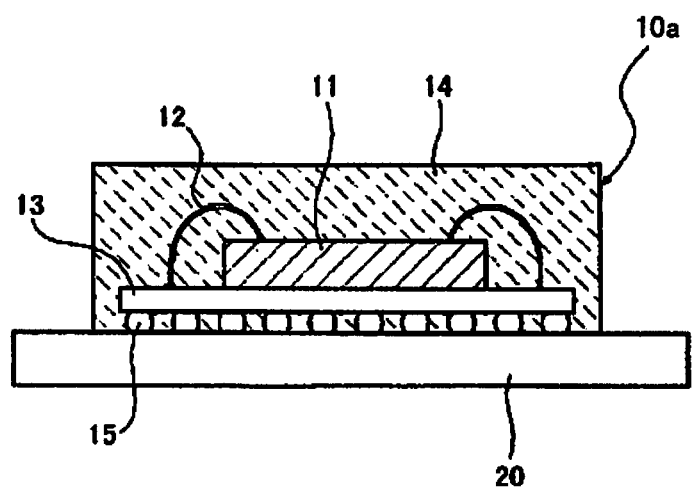
FIG. 13 is a drawing showing a prior art magnetic shielding package.
Figure 14:
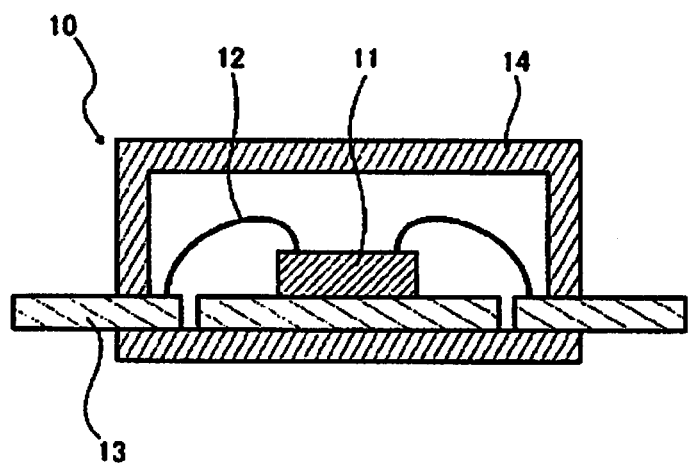
FIG. 14 is a drawing showing a prior art magnetic shielding package.

FIG. 12 shows the structure of a magnetic shielding package of a fourth embodiment.

The magnetic shielding package of the present embodiment is a modification of the first embodiment.

In the first embodiment, the wiring layer 15 is configured to have a laminate structure of a conductor layer 15a made of a material having a high conductivity and a soft magnetic layer 15b made of a soft magnetic material.

If there is no problem with the products, even if the wiring layer 15 has a high resistance, the wiring layer 15 can be made only of a soft magnetic material.

In the present embodiment, as shown in FIG. 12, only a conductive soft magnetic layer is formed on the second insulating material layer 14 to form a single-layer wiring layer 15, and a wiring protection layer 19 is formed thereon.

In this case, in the case of forming the wiring layer 15, it is preferred that the conductivity of the wiring layer is favorably maintained by producing a wiring portion connected to an electrode of the MRAM 11 only by a material having a low resistance such as copper.

When the wiring layer 15 is made only of a soft magnetic material, the magnetic shield part 17 may also be made only of a soft magnetic material.

REFERENCE SIGNS LIST

10 Magnetic shielding package
11 Non-volatile magnetic memory element
12 Support plate
13 First insulating material layer
14, 14a, 14b Second insulating material layer
15 Wiring layer
15a Conductor layer
15b Soft magnetic layer
16a Conductive portion
17 Magnetic shield part
17a Conductor layer
17b Soft magnetic layer
18 Electrode
19 Wiring protection layer
21 Opening
22 Groove
25 Soft magnetic layer
25' Foil
26 Opening
27 Linkage portion
28 Notch
29 Cavity
30 Connection portion
31 Dispenser
32 Soft magnetic paste
33 Dicing line

What is claimed is:

1. A magnetic shielding package of a non-volatile magnetic memory element that suppresses an influence of an external magnetic field on the non-volatile magnetic memory element, comprising:
   a support plate comprising a soft magnetic material;
   a first insulating material layer formed on the support plate;
   a non-volatile magnetic memory element, a face of which opposite to a circuit face of the element is fixed on the first insulating material layer;
   a second insulating material layer that encapsulates the non-volatile magnetic memory element and the periphery thereof;
   a wiring layer provided in the second insulating material layer;
   a soft magnetic layer that is provided in the second insulating material layer and comprises a soft magnetic material;
   a conductive portion that is provided in the second insulating material layer and connects an electrode in the circuit face of the non-volatile magnetic memory element and the wiring layer; and
   a magnetic shield part containing a soft magnetic material that is arranged like a wall with a distance from a side surface of the non-volatile magnetic memory element so as to surround the side surface of non-volatile magnetic memory element partially or entirely, wherein
   the soft magnetic layer and the magnetic shield part are magnetically connected to each other and the wiring layer has a two-layer laminate structure formed of a conductor layer comprising a conductive material and the soft magnetic layer comprising a soft magnetic material.

2. The magnetic shielding package of the non-volatile magnetic memory element according to claim 1, wherein the soft magnetic material arranged like a wall is integrally provided with the support plate.

3. A magnetic shielding package of a non-volatile magnetic memory element that suppresses an influence of an external magnetic field on the non-volatile magnetic memory element, comprising:

a support plate comprising a soft magnetic material;

a first insulating material layer formed on the support plate;

a non-volatile magnetic memory element, a face of which opposite to a circuit face of the element is fixed on the first insulating material layer;

a second insulating material layer that encapsulates the non-volatile magnetic memory element and the periphery thereof;

a wiring layer provided in the second insulating material layer;

a soft magnetic layer that is provided in the second insulating material layer and comprises a soft magnetic material;

a conductive portion that is provided in the second insulating material layer and connects an electrode in the circuit face of the non-volatile magnetic memory element and the wiring layer; and a magnetic shield part containing a soft magnetic material that is arranged like a wall with a distance from a side surface of the non-volatile magnetic memory element so as to surround the side surface of non-volatile magnetic memory element partially or entirely, wherein the soft magnetic layer and the magnetic shield part are magnetically connected to each other and the soft magnetic layer is formed in the second insulating material layer that is between the non-volatile magnetic memory element and the wiring layer, and has an opening in a portion thereof corresponding to an electrode in the circuit face of the non-volatile magnetic memory element, the conductive portion being arranged in the opening.

4. The magnetic shielding package of the non-volatile magnetic memory element according to claim 3, wherein the soft magnetic material arranged like a wall is integrally provided with the support plate.

* * * * *